US010496374B2

United States Patent
Hu et al.

(10) Patent No.: US 10,496,374 B2
(45) Date of Patent: Dec. 3, 2019

(54) CROSSBAR ARRAY OPERATIONS USING ALU MODIFIED SIGNALS

(71) Applicant: HEWLETT PACKARD ENTERPRISE DEVELOPMENT LP, Houston, TX (US)

(72) Inventors: Miao Hu, Palo Alto, CA (US); John Paul Strachan, San Carlos, CA (US)

(73) Assignee: HEWLETT PACKARD ENTERPRISE DEVELOPMENT LP, Houston, TX (US)

(*) Notice: Subject to any disclaimer, the term of this patent is extended or adjusted under 35 U.S.C. 154(b) by 84 days.

(21) Appl. No.: 15/933,081

(22) Filed: Mar. 22, 2018

(65) Prior Publication Data
US 2019/0294416 A1 Sep. 26, 2019

(51) Int. Cl.
G06F 7/57 (2006.01)
G11C 13/00 (2006.01)
G06F 7/544 (2006.01)
H03M 1/66 (2006.01)
H03M 1/12 (2006.01)
G06F 17/16 (2006.01)

(52) U.S. Cl.
CPC .............. *G06F 7/57* (2013.01); *G06F 7/5443* (2013.01); *G11C 13/0002* (2013.01); *G06F 17/16* (2013.01); *G11C 2213/79* (2013.01); *H03M 1/12* (2013.01); *H03M 1/66* (2013.01)

(58) Field of Classification Search
CPC ................................ G06F 7/5443; G06F 17/16
See application file for complete search history.

(56) References Cited

U.S. PATENT DOCUMENTS 9,910,827 B2 3/2018 Muralimanohar et al.
2014/0172937 A1* 6/2014 Linderman ............. G06G 7/16
708/607

(Continued)

FOREIGN PATENT DOCUMENTS

WO WO-2016068920 A1 * 5/2016 .......... G11C 13/003
WO WO-2017146706 8/2017
WO WO-2017171769 10/2017

OTHER PUBLICATIONS

A. Shafiee, A. Nag, N. Muralimanohar, R. Balasubramonian, J.P. Strachan, M. Hu, R.S. Williams, V. Srikumar, "ISAAC: A Convolutional Neural Network Accelerator with In-Situ Analog Arithmetic in Crossbars", Proc. Int'l Symp. on Computer Architecture, 2016 (Year: 2016).*

(Continued)

*Primary Examiner* — Matthew D Sandifer
(74) *Attorney, Agent, or Firm* — Mannava & Kang, P.C.

(57) ABSTRACT

According to examples, an apparatus may include an arithmetic logic unit (ALU) to apply a modification function to a digital input signal to generate a modified digital input signal, a digital-to-analog converter (DAC) to convert the modified digital input signal to an analog input signal, a crossbar array to apply an operation on the analog input signal to generate an analog output signal, and an analog-to-digital converter (ADC). The ADC may modify the analog output signal to compensate for application of the modification function to the digital input signal, may convert the modified analog output signal to a digital output signal, and may output the digital output signal.

20 Claims, 6 Drawing Sheets

(56) References Cited

U.S. PATENT DOCUMENTS

| | | | | |
|---|---|---|---|---|
| 2014/0301413 | A1* | 10/2014 | Ling | H04L 49/101 |
| | | | | 370/542 |
| 2017/0178725 | A1 | 6/2017 | Yang et al. | |
| 2017/0228345 | A1* | 8/2017 | Gupta | G06F 17/141 |
| 2018/0253643 | A1* | 9/2018 | Buchanan | G06N 3/0635 |
| 2018/0364785 | A1* | 12/2018 | Hu | G06F 1/3206 |
| 2019/0034201 | A1* | 1/2019 | Muralimanohar | G06F 9/3001 |
| 2019/0050719 | A1* | 2/2019 | Cantin | G06F 9/5027 |
| 2019/0205741 | A1* | 7/2019 | Gupta | G06N 3/0635 |
| 2019/0235889 | A1* | 8/2019 | Ndu | G06F 9/455 |

OTHER PUBLICATIONS

Gao, L. et al.; "Analog-input Analog-weight Dot-product Operation with Ag/a-si/pt Memristive Devices"; Jul. 17, 2012; 6 pages https://www.ece.ucsb.edu/~strukov/papers/2012/VLSISOCdp2012.pdf.

Gao. L. et al.; "Digital-to-analog and Analog-to-digital Conversion with Metal Oxide Memristors for Ultra-low Power Computing"; Jul. 2013; 5 pages htts://www.researchgate.net/publication/271494379_Digital-to-analog_and_analog-to-digita_conversion_with_metal_oxide_memristors_for_ultra-low_power_computing.

Mao Hu, et al., "Dot-Product Engine for Neuromorphic Computing: Programming 1T1M Crossbar to Accelerate Matrix-Vector Multiplication", Hewlett Packard Labs, DAC 2016, Jun. 5-6, 2016, 7 pages.

Pershin, Y.V. et al.; "Analog-to-digital and Digital-to-Analog Conversion with Memristive Devices"; Nov. 12, 2011; 2 pages https://arxiv.com/pdf/1111.2903.pdf.

* cited by examiner

CROSSBAR ARRAY OPERATIONS USING ALU MODIFIED SIGNALS

BACKGROUND

A memristor crossbar array may be used to process dot-product operations on signals. The crossbar array may be placed between a digital-to-analog convertor (DAC) used to convert digital numbers to analog input signals and an analog-to-digital convertor (ADC) used to read the output signals and convert the output signals to digital result values.

BRIEF DESCRIPTION OF THE DRAWINGS

Features of the present disclosure are illustrated by way of example and not limited in the following figure(s), in which like numerals indicate like elements, in which.

DETAILED DESCRIPTION

Figure 1A:
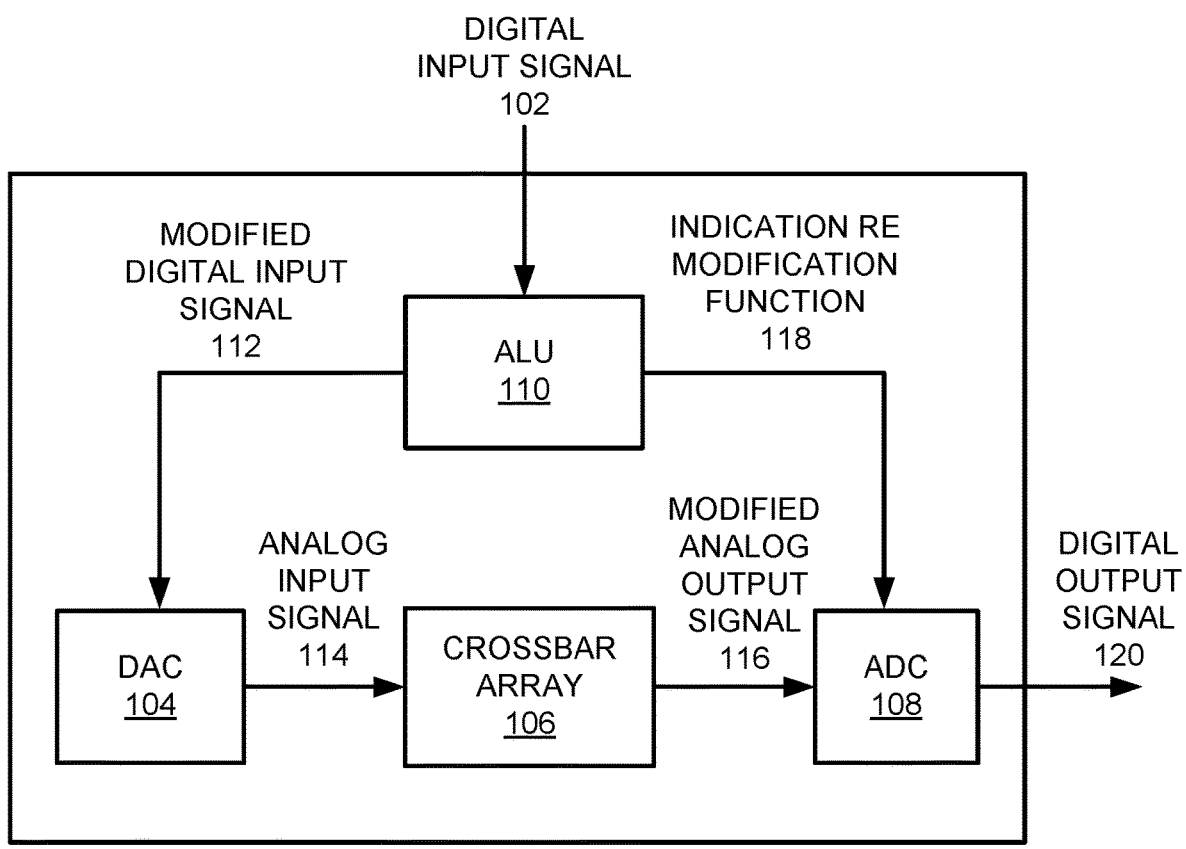
FIG. 1A shows a block diagram of an example apparatus that may include an ALU to modify a digital input signal for a crossbar array to process.

For simplicity and illustrative purposes, the present disclosure is described by referring mainly to examples. In the following description, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure.

Throughout the present disclosure, the terms "a" and "an" are intended to denote at least one of a particular element. As used herein, the term "includes" means includes but not limited to, the term "including" means including but not limited to. The term "based on" means based at least in part on.

Vector-matrix processing techniques may arise in many computing applications. For instance, vector-matrix operations may be utilized in data compression, digital data processing, neural networks, encryption and optimization, or the like. A crossbar array having a plurality of memristors may be used to perform vector-matrix or dot product computations. For example, an input voltage signal from each row of the crossbar may be weighted by the conductance of the resistive devices in each column and accumulated as the current output from each column. Ideally, if wire resistances can be ignored, the current vector, I, flowing out of the crossbar array will be approximately I=VG, where V is the input voltage vector and G is the conductance matrix, including contributions from each memristor in the crossbar array.

The use of memristors at each junction or cross point of the crossbar array enables programming the resistance (or conductance) at each such junction corresponding to the values of G, leading to use of the crossbar array as a dot product engine (DPE). Accuracy and power consumption are generally of concern in the design of dot product engines. In some instances, the crossbar array may have a one polarity input signal limitation in which memristive elements in the crossbar array may have a one transistor to one resistor (1T1R) configuration, which may mean that the transistor may perform linearly in one voltage polarity. As a result, the crossbar array may process input signals having a positive or a negative polarity, but not both. In addition or alternatively, the memristors in the crossbar array may have a positive matrix value limitation in which the conductance value of the memristors must be positive.

Disclosed herein are apparatuses that may include a crossbar array and an arithmetic logic unit (ALU) to modify a digital input signal for submission into the crossbar array that may overcome or compensate for the limitations and/or causes of error in the operation of the crossbar array. Particularly, the ALU may apply a modification function to the digital input signal to modify the digital input signal such that the crossbar array may output accurate analog output signals to the digital input signals. The modification function may, for instance, be a shifting function, a normalization function, an input converting function, a noise filtering function, a thermal compensation function, or the like. In addition, the ALU may apply multiple ones of the modification function depending upon, for instance, parameters of the digital input signal.

The ALU may send the modified output signals to a digital-to-analog converter (DAC), which may convert the modified output signals into analog input signals. The DAC may submit the analog input signals into the crossbar array, which may process the analog input signals to generate analog output signals. The ALU or an analog-to-digital converter (ADC) may modify the analog output signals to compensate for the application of the modification function on the digital input signals. The ADC may also convert the modified analog output signals into digital output signals and the ADC or the ALU may output the digital output signals.

Through implementation of the apparatus and methods disclosed herein, a modified version of an input digital signal may be processed to compensate for limitations and/or possible causes of error in the processing of the input digital signal and may thus determine and output accurate computational results for the input digital signal. In addition, for instance, the modification of the input digital signal may result in the DAC and the ADC in handling a small and fixed range of signals, which may enable the DAC and the ADC to be designed with better performance and/or efficiency, reduced costs, smaller sizes, or the like. Moreover, implementation of the ALU may make the apparatuses operate in a stable manner and may make the apparatus resilient to task loads and environmental changes.

FIG. 1A shows a block diagram of an example apparatus 100 that may include an arithmetic logic unit (ALU) to modify a digital input signal for a crossbar array to process. It should be understood that the apparatus 100 may include additional components and that some of the components described herein may be removed and/or modified without departing from a scope of the apparatus 100 disclosed herein.

The apparatus 100 may include a digital-to-analog converter (DAC) 104, a crossbar array 106, and an analog-todigital converter (ADC) 108. The crossbar array 106 may be a crossbar array of memristors that may apply a set of operations, e.g., dot-product operations, on input signals received from the DAC 104 and may output signals corresponding to results of the applied set of operations to the ADC 108. A memristor may be defined as an electrical component that may limit or regulate a flow of electrical current in a circuit and may be programmed with the amount of charge that has previously flowed through the circuit. Memristors may be non-volatile memory cells, e.g., memristors may retain memory without power. As used herein, the dot-product operation may be an algebraic operation that takes two equal-length sequences of numbers and returns a single number. In examples, the apparatus 100 may be implemented as a dot product engine (DPE) that may process a digital input signal 102, although the apparatus 100 may be implemented for other processes.

According to examples, the apparatus may also include an ALU 110, which may be defined as a combinational digital electronic circuit that performs arithmetic and/or bitwise operations on integer binary numbers. The ALU 110 may apply a modification function to the digital input signal 102 to generate a modified digital input signal 112. The ALU 110 may also send the modified digital input signal 112 to the DAC 104 and the DAC 104 may convert the modified digital input signal 112 to an analog input signal 114. The DAC 104, which may be an integrated circuit or other hardware device that may convert digital signals into analog signals, may also send the analog input signal 114 into the crossbar array 106.

The crossbar array 106 may apply an operation (or a set of operations) on the analog input signal 114, e.g., a computation, a dot-product operation, etc., to generate a modified analog output signal 116. The crossbar array 106 may include memristors in which each of the memristors of the crossbar array 106 may limit or regulate a flow of electrical current in a circuit and may be programmed with the amount of charge that has previously flowed through the circuit. This property may be used to program the crossbar array 106 to perform a certain dot-product operation (or a set of the dot-product operations). The dot-product operation performed in the crossbar array 106 may be an algebraic operation that takes two equal-length sequences of numbers and returns a single number.

The ADC 108 may receive the modified analog output signal 116 along with an indication 118 from the ALU 110 regarding the modification function. The ADC 108 may modify the modified analog output signal 116 to compensate for the application of the modification function and may convert the modified analog output signal 116 into a digital output signal 120. In other examples, however, the ALU 110 may modify the modified analog output signal 116 or a converted version of the modified analog output signal 116 to compensate for the application of the modification function. In any regard, the ADC 108, which may be an integrated circuit or other hardware device that may convert analog signals into digital signals, or the ALU 110 may output the digital output signal 120.

Figure 1B:
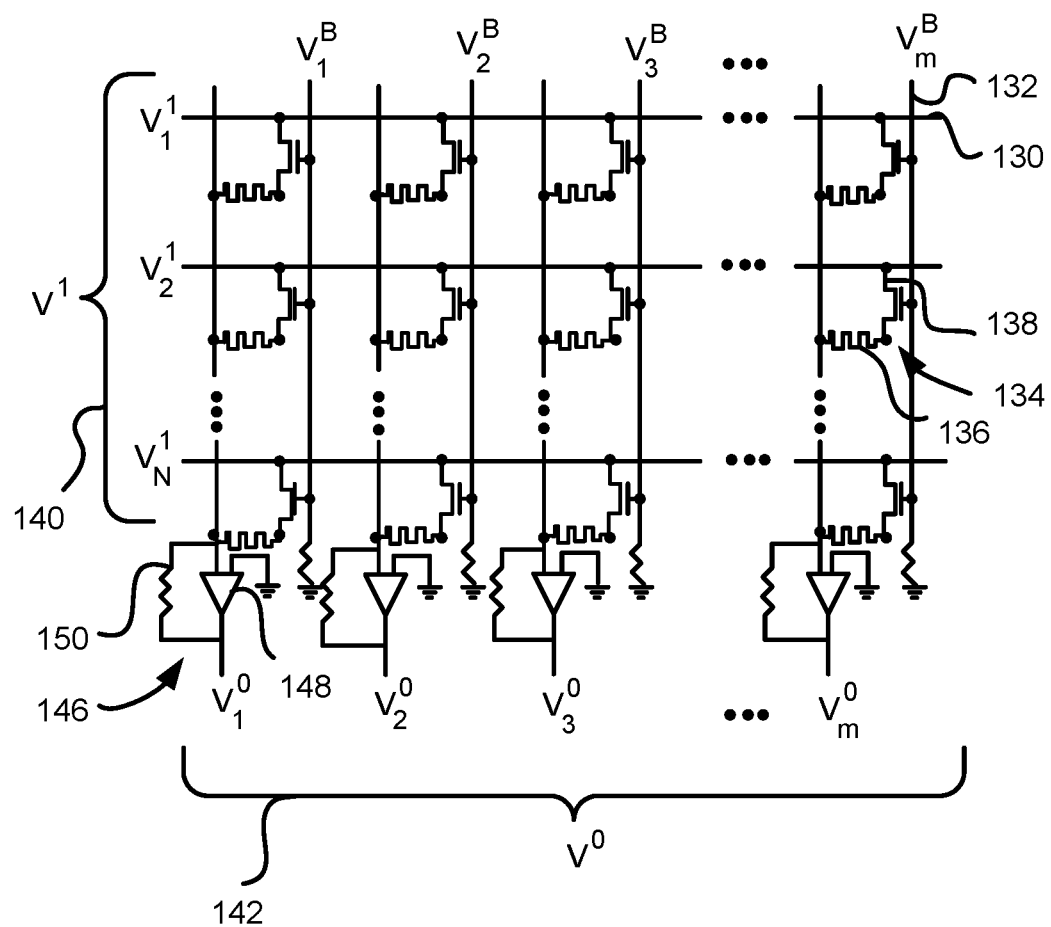
FIG. 1B shows an example crossbar array of the apparatus depicted in FIG. 1A including a plurality of memristors.

Turning now to FIG. 1B, there is shown an example crossbar array 106 of the apparatus 100 depicted in FIG. 1A including a plurality of memristors. The crossbar array 106 may include N row electrodes 130 and M column electrodes 132. The crossbar junctions throughout the crossbar array 106 include a memristive element 134. The memristive element 134, in one example, includes a memristor 136 and a transistor 138. The transistor 138 may be a depletion mode transistor, in the normally ON mode under zero electrical bias.

For example, the transistors 138 may include enhancement-mode metal-oxide semiconductor field-effect transistors (MOSFETs), which are normally OFF where the gate-source voltage is biased to zero volts or ground, and may be turned on by pulling the gate voltage in the direction of the drain voltage; that is, toward the VDD supply rail, which is positive for an n-channel MOSFET (NMOS) logic and negative for a p-channel MOSFET (PMOS) logic. In a depletion-mode MOSFET, the device is normally ON at zero gate-source voltage. Such devices are used as load "resistors" in logic circuits (in depletion-load NMOS logic, for example). For N-type depletion-mode devices, the threshold voltage may be about −3 V, so it may be turned OFF by pulling the gate 3 V negative (the drain, by comparison, is more positive than the source in NMOS). In a PMOS, the polarities are reversed.

The transistors 138 may be activated when programming the memristors 136 to map the mathematic matrix, which may be a much less frequent operation than a dot-product operation. Therefore, the transistors 138 may remain in their conducting state, i.e., ON state without gate bias, which may significantly reduce the total energy cost. Low resistance in the ON state of the transistors 138 may also be beneficial. In general, the ON state resistance of the transistors 138 may be lower than that of the memristors 136. When programming a selected memristor 136, all the access transistors 138 may be turned OFF by gate biasing except for the transistors 138 in the column 132 with the selected memristor 138.

The crossbar array 106 may include a vector input register or vector input 140 for applying voltages to the row electrodes 132 and a vector output register or vector output 142 for receiving output voltages resulting from current flows in the column electrodes 144. The crossbar array 106 may also include sense circuitry 146 for converting an electrical current in a column electrode 134 to a voltage. In one example, the sense circuitry 146 may include an operational amplifier 148 and a resistor 450 that may be arranged to provide a virtual ground circuit.

The crossbar array 106 may permit the use of memristors 136 having linear voltage-current characteristics for storing the matrix of conductance values $G_{ij}$ in the crossbar junctions of the array. In examples that include use of normally ON transistors 138, each of the conductance values $G_{ij}$ may be set by sequentially imposing a voltage drop over each of the crossbar junctions. For example, the conductance value $G_{2,3}$ may be set by applying a voltage equal to $V_{Row2}$ at the $2^{nd}$ row of the crossbar array 106 and a voltage equal to $V_{Col3}$ at the $3^{rd}$ column of the array 106. Note that when applying a voltage at a column electrode 132, the sense circuitry 146 for that electrode may be switched out and a voltage driver switched in. The voltage difference $V_{Row2}-V_{Col3}$ will generally determine the resulting conductance value $G_{2,3}$ based on the characteristics of the memristive element 134 located at the intersection. In order to isolate the memristive element 134 being programmed, according to one example, the gate voltage electrode, $V_i^B$, at each of the unselected columns is set to a non-zero bias which, for normally ON transistors 138, has the effect of turning OFF the current flow through the transistor 138. An input voltage, $V_i^I$, may then be applied to the selected row electrode 130, while unselected row electrodes are grounded or allowed to float. In this manner of programming—i.e., using transistors 138 coupled with linear memristors 136-sneak path currents may be greatly reduced or even eliminated. During dot-product engine operations, gate voltage may not be needed for any normally ON transistor 138. Only when the memristor array is being programmed to represent a new N×M matrix of values, are non-zero voltages applied to the transistor gates. However, the programming operation may occur much less frequently than a dot-product operation to the array; therefore, using normally ON transistors 138 may significantly lower the operation energy.

In some instances, the crossbar array 106 may have a one polarity input signal limitation. That is, the memristive elements 134 in the crossbar array 106 may have a one transistor 138 to one resistor 136 (1T1R) configuration as shown in FIG. 1B, which may mean that the transistor 138 may perform linearly in one voltage polarity. As a result, the crossbar array 106 may process input signals having a positive or a negative polarity, but not both. In addition or alternatively, the memristors 136 in the crossbar array 106 may have a positive matrix value limitation in which the conductance value of the memristors 136 must be positive. In addition, as the DAC 104 and the ADC 108 may be independent from each other, the DAC 104 and the ADC 108 may not adapt well to values with large dynamic ranges. For example, if a previous signal vector is large and the next signal vector is small, the DAC 104 may output a large signal for the first vector and a small signal for the next vector. In these instances, the small signal may be too low for the ADC 108 to sense.

According to examples, the ALU 110 may apply a modification function to the digital input signal 102 to compensate for or overcome the limitations and/or possible causes of error discussed above. For instance, the ALU 110 may improve correlations between the DAC 104 and ADC 108 with respect to the operations performed by the crossbar array 106. The modification function may include any of the following modification functions, which may be defined by instructions included in the operand (e.g., values inputted into the ALU 110).

A normalizing function. The ALU 110 may normalize the digital input signal 102, through, for instance, a statistical operation used to scale heterogeneous sets of data, so that the sets of data may be compared relevantly. For example, the input signal values may be normalized as x_Norm=[x−min(x)]/[max(x)−min(x)], where x is signal value. The normalization may allow the crossbar array 106 to perform at an optimized accuracy level. The normalization may also allow a transimpedance amplifier (TIA) (not shown) coupled to the crossbar array 106 and the ADC 108 to perform at an optimal sensing range. The ADC 108 may restore the true (actual signal) result based on the known normalization factor outputted by the ALU 110.

An input converting function. The ALU 110 may detect that the digital input signal 102 may not be suitable for the crossbar array 106 to process. For example, sparse digital input signals may not be suitable for the crossbar array 106 to process. In these examples, the ALU 110 may convert he sparse digital input signals into dense vectors, which may be suitable for processing by the crossbar array 106.

A shifting function. The ALU 110 may shift the digital input signal 102 such that, for instance, in instances in which the digital input signal 102 is a negative value, the digital input signal 102 is shifted to be a positive value. For example, if a digital input signal A contains both positive and negative values, to compute AX in one signal processing apparatus (e.g., the crossbar array 106), the ALU 110 may first shift A to A+Ic, where I is an identity matrix, and c is a shifting scalar, which is sufficient to compensate the least negative value in A. For example, if A is negative 3, the Ic may be 3.01. Thus, the shifted digital input signal 102 may always be positive. The ALU 110 may program A+Ic into to the crossbar array 106. Then, the crossbar array 106 may produce the correct result of AX by the ADC 108 output value−sum(X)*c in the ALU 110 since the ADC 108 output value=(A+Ic)X. The shifting function may be applied to the input vector as well. Thus, the crossbar array 106 may process digital input signals 102 having negative values.

A noise filtering function. The ALU 110 may apply over-sampling or averaging functions to the digital input signal 102 to increase the accuracy of the digital output signal 120. For example, in instances in which the digital input signal 102 is a low level signal vector and the baseline noise of the apparatus 100 is higher than the digital input signal 102, the digital output signal 120 may be lower (e.g., below the baseline noise level). The ALU 110 may repeat the operation in the crossbar array 106 several times so the ALU 110 may average the output signal values. This may increase the accuracy of the digital output signal 120 because the signal to noise ratio may be increased. The ADC 110 may remove the noise (or crossbar array errors) to obtain a final digital output signal 120.

A thermal compensation function. In many instances, the memristors 136 in the crossbar array 106 may become more conductive and nonlinear with higher temperatures, which may result in a loss in accuracy. That is, higher than normal temperatures may cause the resistance levels of the memristors 136 in the crossbar array 106 to be reduced by a scaling factor. One result of this change in resistance levels may be that the crossbar array 106 may output higher digital output signals 120, which may thus be inaccurate. To compensate for this occurrence, the ALU 110 may apply a thermal compensation function to the digital input signal 102 to compensate for the thermal accuracy loss. For instance, the ALU 110 may pre-scale the digital input signal 102 prior to providing the signal to the DAC 104. In addition or in another example, the ALU 110 may instruct the ADC 108 to correct (e.g., rescale) the modified analog output signal 116 based on a known dependency (i.e., the scaling factor) between the temperature and the output.

An adding floating point digital numbers processing function. The DAC 104 may transfer fixed point digital numbers within an input signal and may not process the floating point digital numbers. The ALU 110 may convert the floating point digital numbers in the digital input signal 102 to fixed point numbers that the DAC 104 may process.

According to the examples, the ALU 110 may be programmed to perform one of the modification functions or may be programmed to perform multiple ones of the modification functions. For example, in instances in which the ALU 110 detects that the digital input signal 102 includes a negative value, the ALU 110 may perform a shifting function. Likewise, in instances in which the ALU 110 detects that the temperature of the apparatus 100 is above a predefined level and that the digital input signal 102 includes a negative value, the ALU 110 may perform the thermal compensation function and the shifting function.

In examples, the ALU 110 may determine which of the modification functions that the ALU 110 may perform on the digital input signal 102 based on a parameter of the digital input signal 102. For example, in instances in which the digital input signal 102 has a wide range of values, the ALU 110 may determine that the digital input signal 102 may be normalized through application of a normalizing function. In instances in which the digital input signal 102 has negative values, the ALU 110 may determine that a shifting function may be applied to the digital input signal 102. In instances in which the ALU 110 detects that the digital input signal 102 includes sparse signals, the ALU 110 may convert the sparse signal into a dense vector through application of an input converting function.

Following application of the modification function to the digital input signal 102, the ALU 110 may send an indication regarding the applied modification function to the ADC 108. In addition, the ADC 108 may modify the modified analog output signal 116 to compensate for the application of the modification function to the digital input signal 102 to restore the modified analog output signal 116 to accurately reflect the correct outputs of the crossbar array 106. For example, the ADC 108 may use a gain or offset to restore the modified analog output signal 116 prior to converting the modified analog output signal 116 into the digital output signal 120. Thus, the digital output signal 120 may be an accurate result of the processing applied to the digital input signal 102 by the crossbar array 106.

The apparatus 100 may be connected to a processor or may include a processor having an integrated ALU 110. The processor may be a semiconductor-based microprocessor, a central processing unit (CPU), an application specific integrated circuit (ASIC), a field-programmable gate array (FPGA), and/or another hardware device. It should be understood that the apparatus 100 may include multiple processors, multiple cores, or the like, without departing from a scope of the apparatus 100. The apparatus 100 may also include a non-transitory computer readable medium (not shown) that may have stored thereon machine-readable instructions executable by the processor to control the ALU 110.

Figure 2:
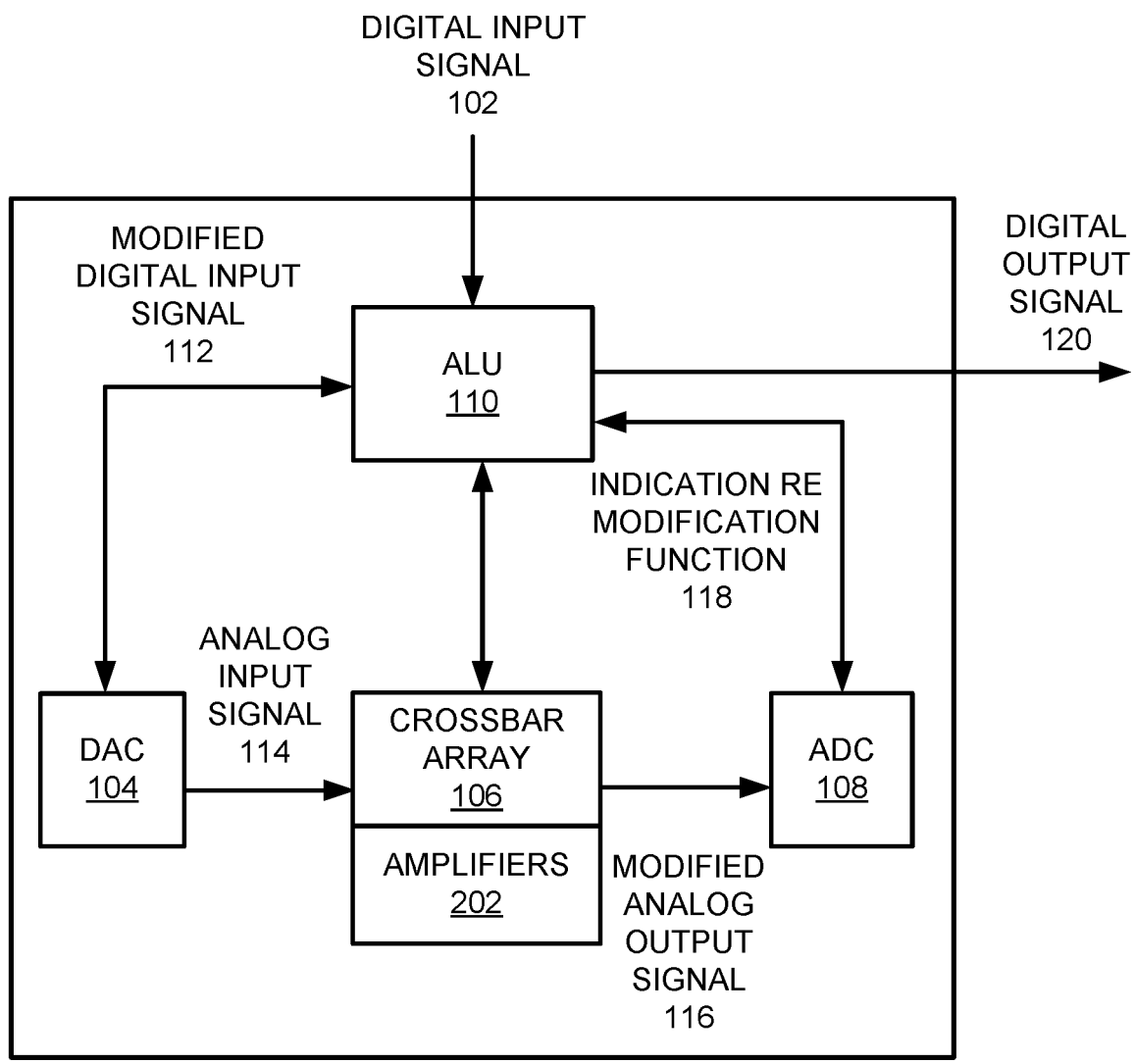
FIG. 2 shows an example apparatus that may include an ALU to modify a digital input signal for a crossbar array to process.

With reference to FIG. 2, there is shown an apparatus 200 that may include an ALU 110 to modify a digital input signal for a crossbar array to process. Similarly to the apparatus 100 depicted in FIG. 1A, the apparatus 200 may include a DAC 104, a crossbar array 106, an ADC 108, and the ALU 110. In addition, the ALU 110 may apply a modification function to a digital input signal 102, which the ALU 110 may send to the DAC 104 as also discussed above. The apparatus 200 depicted in FIG. 2 may differ from the apparatus 100 depicted in FIG. 1A in that the apparatus 200 may provide for bi-directional interactions between the ALU 110, the DAC 104, the crossbar array 106 and the ADC 108. In addition, the crossbar array 106 may include or may be coupled to amplifiers 202.

The amplifiers 202, e.g., amplifiers 148 depicted in FIG. 1B, may control the analog signals received from the DAC 104 in terms of any offset (e.g., gain or bias) that may be applied to correct an analog input signal 114 before an analog output signal 116 is fed to the ADC 108. For example, the ALU 110 may have performed a shifting function on the digital input signal 102 such that the shift (or offset value) may be accounted for in the analog output signal 116. The ALU 110 may provide the shift value to the amplifiers 202 and the amplifiers 202 may correct an analog signal processed through an operation in the crossbar array 106 prior to being converted into the digital output signal by the ADC 108.

In examples, the ALU 110 may buffer digital input signals 102 between signal processing operations in the crossbar array 106 and may modify the digital input signals 102, e.g., may apply a modification function on the digital input signals 102. The ALU 110 may also pass the modified digital input signals 112 over a period of time. In examples in which the ALU 110 determines that the digital input signals 102 are not to be modified, the ALU 110 may send unmodified versions of the digital input signals 102 to the DAC 104 from a buffer. In addition, the ALU 110 may function as an intermediary between the DAC 104 and the crossbar array 106 in which the ALU 110 may receive the analog input signal 114 from the DAC 104 and the ALU 110 may send the analog input signal 114 to the crossbar array 106.

In an example, the analog signals from the crossbar array 106 may be sampled and converted from current to voltage. The amplifier 202 may produce a modifiable gain and/or bias (offset). The ALU 110 may modify a gain or bias setting based on the modification function applied by the ALU 110. In one example, the ALU 110 may perform modifications of the outputs from the ADC 108. The ALU 110 may configure the ADC 108 to perform some of simple modifications as well. However, the ALU 110 may perform complex signal modifications involving nonlinear transformations. Thus, for instance, the crossbar array 106 may output the modified analog output signal 116 to the ADC 108 and the ADC 108 may output a digitally converted version of the modified analog output signal 116 to the ALU 110. The ALU 110 may modify the digital version of the modified analog output signal 116 to a digital output signal 120 and the ALU 110 may output the digital output signal 120. Accordingly, the ALU 110 depicted in FIG. 2 may have greater interactions with the other components of the apparatus 200 as compared with the ALU 110 depicted in FIG. 1A.

Figure 3:
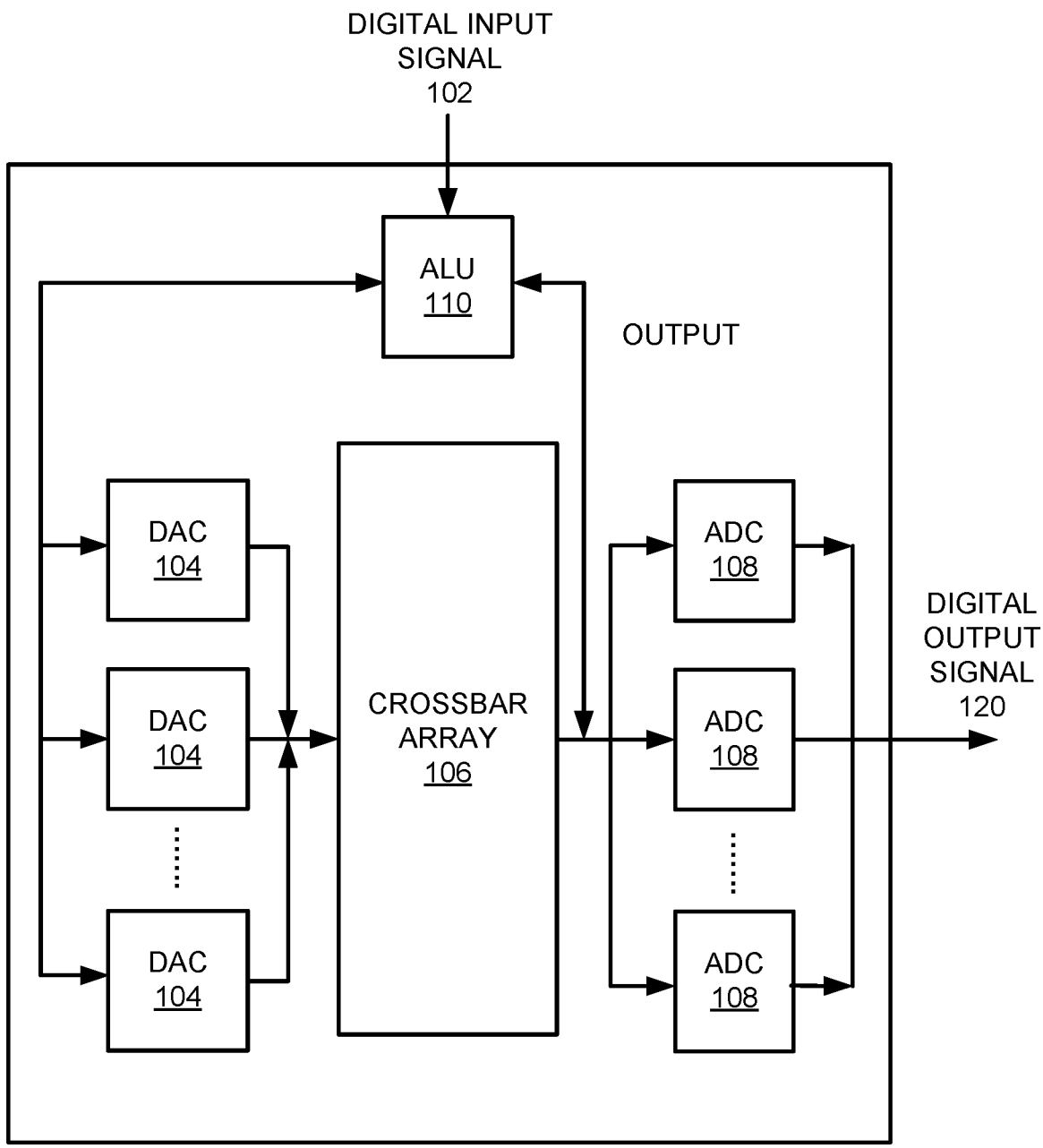
FIG. 3 shows an example apparatus that may include an ALU to apply a modification function to a digital input signal to compensate for limitations and/or possible causes of error in a crossbar array.

FIG. 3 shows an example apparatus 300 that may include an ALU 110 to apply a modification function to a digital input signal to compensate for limitations and/or possible causes of error in a crossbar array 106. The apparatus 300 may be similar to either of the apparatuses 100, 200 depicted in FIGS. 1A and 2. The apparatus 300 may differ from the apparatus 100, 200 in that the apparatus 300 may include a plurality of DACs 104 and a plurality of ADCs 108. Although not shown, each of the DACs 104 and the ADCs 108 may be in bi-directional communication with the ALU 110 in similar fashion to the configuration shown in FIG. 2.

Each of the DACs 104 may function in similar fashion to the DACs 104 depicted in FIGS. 1A and 2. Likewise, each of the ADCs 108 may function in similar fashion to the ADCs 104 depicted in FIGS. 1A and 2. In addition, the ALU 110 may send modified or unmodified digital input signals 112 to the DACs 104, for instance, in a preset order or in a random order, such that the DACs 104 may individually convert the digital input signals 112 into analog signals. Each of the DACs 104 may also submit the analog signals 114 into the crossbar array 106 and/or may send the analog signals 114 back to the ALU 110 and the ALU 110 may submit the analog signals 114 to the crossbar array 106. In addition, the crossbar array 106 may process the analog signals 114, e.g., may perform a computation, a dot product process, or the like, on the analog signals 114 and may output the output signals 116 to the ADCs 108 and/or to the ALU 110. In addition, the ALU 110 and/or the ADCs 108 may modify the output signals 116 to compensate for the application of the modification function on the input signal 102. The ADCs 108 may convert the modified output signals from analog to digital form and the ADCs 108 may output the digital output signal 120.

According to examples, through implementation of the multiple DACs 104 and ADCs 108 as depicted in FIG. 3, the apparatus 300 may process a larger number of digital input signals 102 over a shorter period of time as compared with the apparatus 100, 200. In addition, arranging the DACs 104 into an array as shown in FIG. 3 may improve performance of the crossbar array 106 and may decrease an error rate of the digital-to-analog conversion.

Figure 4:
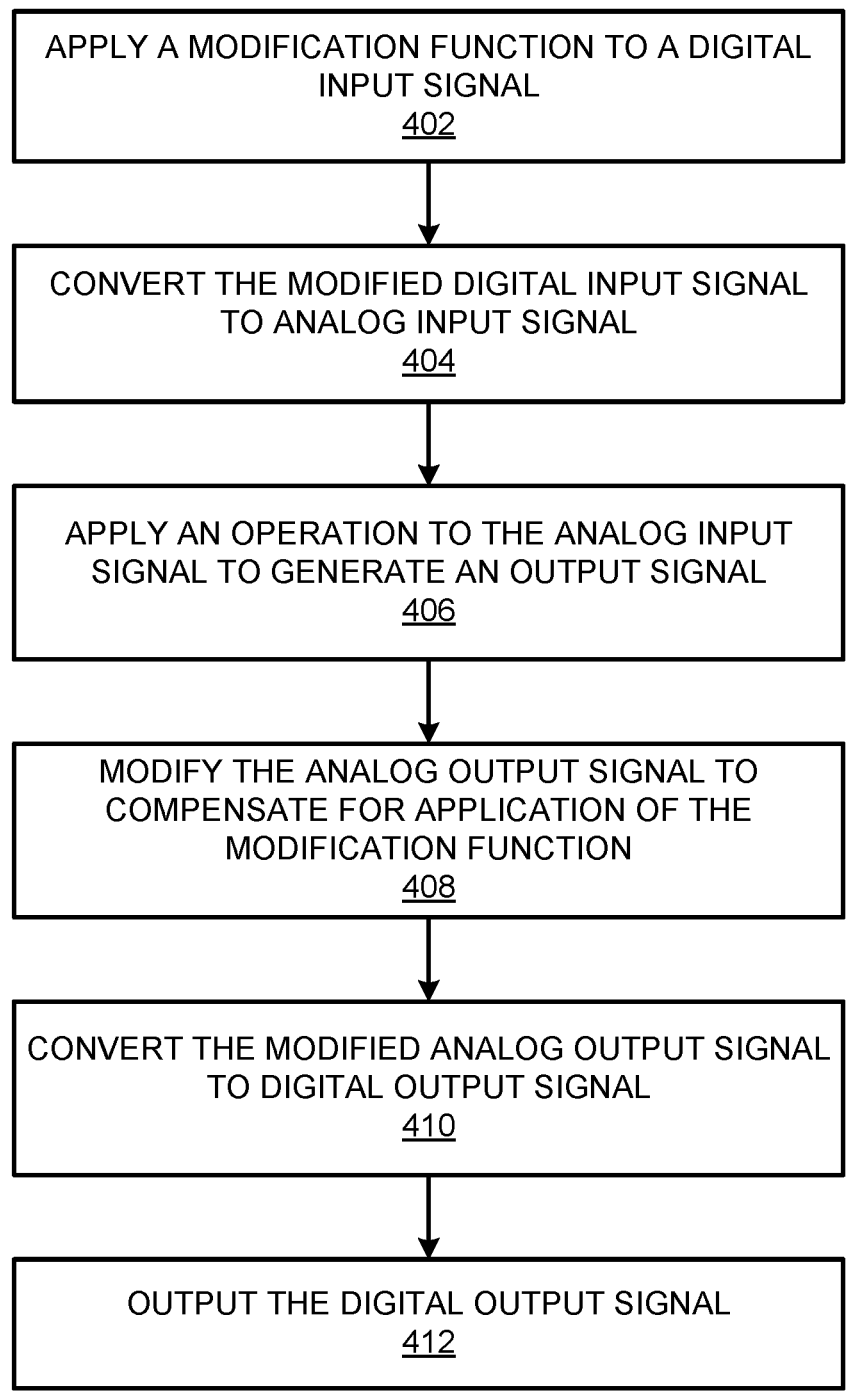
FIGS. 4-5, respectively, show flow diagrams of example methods for implementing a device to modify a digital input signal to compensate for limitations and/or possible causes of error in an apparatus including a crossbar array.
Figure 5:
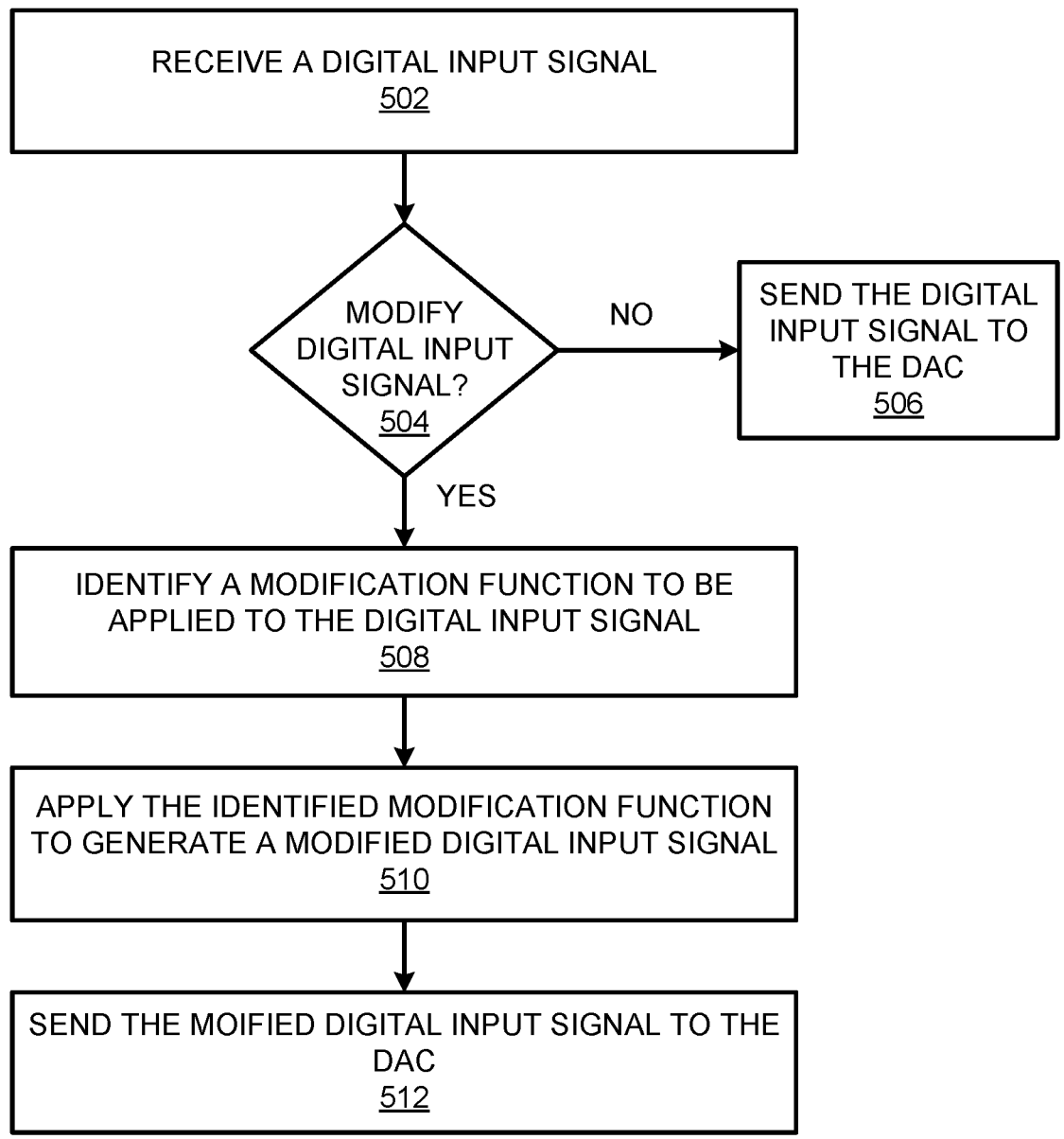

Various manners in which any of the apparatuses 100, 200, 300 may operate are discussed in greater detail with respect to the methods 400, 500 respectively depicted in FIGS. 4 and 5. Particularly, FIG. 4 depicts a flow diagram of an example method 400 for implementing a device, e.g., an ALU 110, to modify a digital input signal to compensate for limitations and/or possible causes of error in an apparatus 100, 200, 300 including a crossbar array 106. FIG. 5 depicts a flow diagram of another example method 500 for implementing a device to modify a digital input signal to compensate for limitations and/or possible causes of error in an apparatus 100, 200, 300 including a crossbar array 106. It should be understood that the methods 400 and 500 may include additional operations and that some of the operations described therein may be removed and/or modified without departing from the scopes of the methods 400, 500. The descriptions of the methods 400 and 500 are made with reference to the features depicted in FIGS. 1A-3 for purposes of illustration.

With reference first to FIG. 4, at block 402, a device, e.g., the ALU 110, may apply a modification function to a digital input signal 112 to generate a modified digital input signal 112. For example, the modification function may be a normalizing function, an input converting function, a shifting function, a noise filtering function, a thermal compensation function, and/or the like. The ALU 110 may also send the modified digital input signal 112 to a DAC 104 (FIGS. 1A, 2) or may send multiple modified digital input signals 112 to an array of DACs 104 (FIG. 3).

At block 404, the DAC(s) 104 may convert the modified digital input signal(s) 112 to an analog input signal(s) 114. That is, the DAC 104 (FIG. 1A) may convert the abstract numbers from the modified digital signal 112 into a conceptual sequence of impulses that a reconstruction filter may process using some form of interpolation to fill in data between the impulses. The DAC(s) 104 may also send the analog input signal(s) 114 to the crossbar array 106 and/or to the ALU 110. In instances in the ALU 110 receives the analog input signal(s) 114, the ALU 110 may buffer the received analog input signal(s) 114 and may submit the analog input signal(s) 114 in an order into the crossbar array 106.

At block 406, the crossbar array 106, and particularly, the memristors 136 in the crossbar array 106, may apply an operation to the analog input signal(s) 114 to generate a modified analog output signal 116 or modified analog output signals 116. For example, the operation may be a dot-product operation or other computation performed in the crossbar array 106. The crossbar array 106 may output the modified analog output signal(s) 116 to the ADC(s) 108 and/or to the ALU 110. In addition, amplifiers 202 may amplify the analog output signal(s) 116 prior to the analog output signal(s) being outputted.

At block 408, the ADC(s) 108 and/or the ALU 110 may modify the modified analog output signal(s) 116 to compensate for the application of the modification function on the digital input signal(s) 102. For example, the ADC(s) 108 and/or the ALU 110 may apply a shift (or offset value) to correct the output signal(s) 116.

At block 410, the ADC(s) 108 may convert the modified analog output signal 116 to a digital output signal 120 or may convert modified analog output signals 116 to digital output signals 120. For example, the ADC(s) 108 may convert a sequence of impulses from the modified analog output signal 116 into abstract numbers representing a digital output signal 120. At block 412, the ADC(s) 108 may output the digital output signal(s) 120. In some examples, the ADC(s) 108 may output the digital output signal(s) 120 to the ALU 110 and the ALU 110 may output the digital output signal(s) 120.

With reference now to FIG. 5, it should be noted that the method 500 may be implemented prior to the method 400 or as part of the method 400. At block 502, the ALU 110 may receive a digital input signal 102. At block 504, the ALU 110 may determine whether the digital input signal 102 is to be modified. For example, the ALU 110 may check a parameter of the digital input signal 102 to determine whether the signal 102 includes a range of values for possible normalization, may check the signal 102 for negative values, may detect whether the signal 102 includes a sparse signal, whether an ambient temperature is outside of a predefined range, and/or the like.

Based on a determination that the digital input signal 102 is not to be modified at block 504, the ALU 110 may send the digital input signal 102 to the DAC 104 as indicated at block 506. In addition, the ALU 110 may repeat blocks 502-506 for an additionally received digital input signal 102.

However, based on a determination that the digital input signal 102 is to be modified at block 504, the ALU 110 may identify a modification function to be applied to the digital input signal 102 as indicated at block 508. Particularly, the ALU 110 may identify a modification function that corresponds to or is to compensate for the parameter that caused the ALU 110 to determine that the digital input signal 102 is to be modified. Various examples of modification functions and parameters are discussed above.

At block 510, the ALU 110 may apply the identified modification function to the digital input signal 102 to generate a modified digital input signal. In addition, at block 512, the ALU 110 may send the modified digital input signal to the DAC 104.

Through implementation of the methods 400 or 500, an apparatus 100, 200, 300 may process a modified version of an input digital signal 102 to compensate for limitations and/or possible causes of error in the processing of the input digital signal 102 and thus determine and output accurate computational results for the input digital signal.

Some or all of the operations set forth in the methods 400 and 500 may be contained as utilities, programs, or subprograms, in any desired computer accessible medium. In addition, the methods 400 and 500 may be embodied by computer programs, which may exist in a variety of forms. For example, some operations of the methods 400 and 500 may exist as machine readable instructions, including source code, object code, executable code or other formats. Any of the above may be embodied on a non-transitory computer readable storage medium.

Examples of non-transitory computer readable storage media include computer system RAM, ROM, EPROM, EEPROM, and magnetic or optical disks or tapes. It is therefore to be understood that any electronic device capable of executing the above-described functions may perform those functions enumerated above.

Although described specifically throughout the entirety of the instant disclosure, representative examples of the present disclosure have utility over a wide range of applications, and the above discussion is not intended and should not be construed to be limiting, but is offered as an illustrative discussion of aspects of the disclosure.

What has been described and illustrated herein is an example of the disclosure along with some of its variations. The terms, descriptions and figures used herein are set forth by way of illustration only and are not meant as limitations. Many variations are possible within the spirit and scope of the disclosure, which is intended to be defined by the following claims—and their equivalents—in which all terms are meant in their broadest reasonable sense unless otherwise indicated.

What is claimed is:

1. An apparatus comprising:
an arithmetic logic unit (ALU) to apply a modification function to a digital input signal to generate a modified digital input signal;
a digital-to-analog converter (DAC) to convert the modified digital input signal to an analog input signal;
a crossbar array to apply an operation on the analog input signal to generate an analog output signal; and
an analog-to-digital converter (ADC) to:
modify the analog output signal to compensate for application of the modification function to the digital input signal;
convert the modified analog output signal to a digital output signal; and
output the digital output signal.

2. The apparatus of claim 1, wherein the ALU is to output the modified digital input signal to the DAC and the DAC is to output the modified analog input signal to the crossbar array.

3. The apparatus of claim 1, wherein the operation is a set of dot-product operations.

4. The apparatus of claim 1, wherein the crossbar array comprises an array of memristors.

5. The apparatus of claim 1, wherein the ALU is further to determine whether the digital input signal is to be modified and to apply the modification function based on a determination that the digital input signal is to be modified.

6. The apparatus of claim 5, wherein the modification function is any of:
a normalizing function;
an input converting function;
a shifting function;
a noise filtering function;
a thermal compensation function; and
a floating point converting function.

7. The apparatus of claim 6, wherein the normalizing function is to regulate a dynamic range of the digital input signal by applying a normalization factor.

8. The apparatus of claim 6, wherein the input converting function is to convert sparse signals of the digital input signal into dense vectors.

9. The apparatus of claim 6, wherein the shifting function is to convert negative signal values of the digital input signal to positive values.

10. The apparatus of claim 6, wherein the noise filtering function is to over-sample or to average the digital inputs signal values based on repeated operations in the ALU and/or crossbars.

11. The apparatus of claim 6, wherein the thermal compensation function is to compensate for the analog output signal accuracy loss through the crossbar due to increased conductivity of memristors resulting from a high temperature.

12. The apparatus of claim 6, wherein the floating point converting function is to convert floating point numbers of the digital input signal to fixed point numbers prior to providing the digital input signal to the DAC.

13. An apparatus comprising:
a digital-to-analog converter (DAC);
an analog-to-digital converter (ADC);
a crossbar array;
a set of amplifiers; and
a device to:
determine whether a digital input signal is to be modified;
based on a determination that the digital input signal is to be modified, apply a modification function to the digital input signal to generate a modified digital input signal;
output the modified digital input signal to the DAC;
output an indication that the modification function was applied to the digital input signal, wherein:
the DAC is to convert the modified digital input signal to an analog input signal;
the crossbar array is to:
receive the analog input signal;
apply an arithmetic operation on the analog input signal to generate an analog output signal;
the set of amplifiers are to sample and convert signals from the crossbar array from current to voltage; and
the ADC is to:
receive the indication that the modification function was applied to the digital input signal;
receive the analog output signal from the crossbar array;
modify the analog output signal to reverse the application of the modification function to the digital input signal;
convert the modified analog output signal to a digital output signal; and
output the digital output signal.

14. A method comprising:
applying, by a device, a modification function to a digital input signal to generate a modified digital input signal;
converting, by a digital-to-analog converter (DAC), the modified digital input signal to an analog input signal;
applying, by a crossbar array, an operation to the analog input signal to generate an analog output signal;
modifying, by an analog-to-digital converter (ADC), the analog output signal to compensate for application of the modification function on the digital input signal;
converting, by the ADC, the modified analog output signal to a digital output signal; and
outputting, by the ADC, the digital output signal.

15. The method of claim 14, further comprising:
determining whether the digital input signal is to be modified;
applying the modification function based on a determination that the digital input signal is to be modified; and
outputting the digital input signal to the DAC based on a determination that the digital input signal is not to be modified.

16. The method of claim 14, further comprising:
applying the modification function to regulate a dynamic range of the digital input signal by applying a normalization factor.

17. The method of claim 14, further comprising:
applying the modification function to convert sparse signals within the digital input signal into dense vectors.

18. The method of claim 14, further comprising:
applying the modification function to convert negative signal values of the digital input signal to positives.

19. The method of claim 14, further comprising:
applying the modification function to over-sample or to average the digital input signal values.

20. The method of claim 14, further comprising:
applying the modification function to compensate for a digital output signal accuracy loss resulting from a high temperature.

* * * * *